United States Patent
Kato et al.

(10) Patent No.: US 7,507,146 B2
(45) Date of Patent: Mar. 24, 2009

(54) METHOD FOR PRODUCING SEMICONDUCTOR WAFER AND SEMICONDUCTOR WAFER

(75) Inventors: Tadahiro Kato, Fukushima (JP); Masayoshi Sekizawa, Niigata (JP); Mamoru Okada, Nagano (JP); Hisashi Kijima, Gunma (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 0 days.

(21) Appl. No.: 11/666,082

(22) PCT Filed: Oct. 12, 2005

(86) PCT No.: PCT/JP2005/018745

§ 371 (c)(1),
(2), (4) Date: Apr. 24, 2007

(87) PCT Pub. No.: WO2006/046403

PCT Pub. Date: May 4, 2006

(65) Prior Publication Data

US 2008/0096474 A1  Apr. 24, 2008

(30) Foreign Application Priority Data

Oct. 27, 2004 (JP) ............................ 2004-312195

(51) Int. Cl.
*B24B 1/00* (2006.01)

(52) U.S. Cl. .............................. 451/41; 451/44; 451/57; 451/66; 451/254; 438/692; 257/E21.214

(58) Field of Classification Search .................... 451/41, 451/44, 57, 58, 63, 65, 66, 242, 246, 254, 451/261, 262, 269, 287, 290; 438/692; 257/E21.214
See application file for complete search history.

(56) References Cited

U.S. PATENT DOCUMENTS 5,295,331 A * 3/1994 Honda et al. .................. 451/44

(Continued)

FOREIGN PATENT DOCUMENTS

EP  1 306 891 A1  5/2003

(Continued)

*Primary Examiner*—Eileen Morgan
(74) *Attorney, Agent, or Firm*—Oliff & Berridge, PLC

(57) ABSTRACT

The present invention is a method for producing a semiconductor wafer, comprising: at least a double-side polishing step; and a chamfered-portion polishing step; wherein as a first chamfered-portion polishing step, at least, a chamfered portion of the wafer is polished so that a chamfered surface of each of main surface sides in the chamfered portion is in contact with a polishing pad; then the double-side polishing is performed; as a second chamfered-portion polishing step, at least, the chamfered portion of the wafer is polished so that an end surface of the chamfered portion is in contact with a polishing pad and so that both main surfaces of the wafer are not in contact with a polishing pad. Thereby, when a semiconductor wafer is produced, scratch and such generated in the chamfered portion in a double-side polishing process can be removed and, excessive polishing in a peripheral portion of a main surface can be prevented from being caused in polishing a chamfered portion. Therefore, a method for producing a semiconductor wafer having a high flatness even in the vicinity of a chamfered portion, and the semiconductor wafer are provided.

32 Claims, 12 Drawing Sheets

U.S. PATENT DOCUMENTS

| | | | |
|---|---|---|---|
| 5,727,990 A * | 3/1998 | Hasegawa et al. | 451/44 |
| 5,769,695 A * | 6/1998 | Katayama | 451/298 |
| 5,942,445 A * | 8/1999 | Kato et al. | 438/691 |
| 6,066,565 A * | 5/2000 | Kuroki et al. | 438/692 |
| 6,162,730 A * | 12/2000 | Kai et al. | 438/690 |
| 6,174,222 B1 * | 1/2001 | Sato et al. | 451/44 |
| 6,250,995 B1 * | 6/2001 | Hakomori | 451/66 |
| 6,261,160 B1 * | 7/2001 | Hakomori | 451/66 |
| 6,284,658 B1 * | 9/2001 | Kato et al. | 438/690 |
| 6,334,808 B1 * | 1/2002 | Tanaka | 451/44 |
| 6,491,836 B1 * | 12/2002 | Kato et al. | 216/88 |
| 6,962,521 B2 * | 11/2005 | Mizushima | 451/44 |
| 2006/0042317 A1 * | 3/2006 | Miyamoto | 65/61 |
| 2007/0158308 A1 * | 7/2007 | Koyata et al. | 216/88 |

FOREIGN PATENT DOCUMENTS

| | | |
|---|---|---|
| JP | A 2002-299290 | 10/2002 |
| JP | A 2003-340695 | 12/2003 |
| WO | WO 02/05337 A1 | 1/2002 |

* cited by examiner

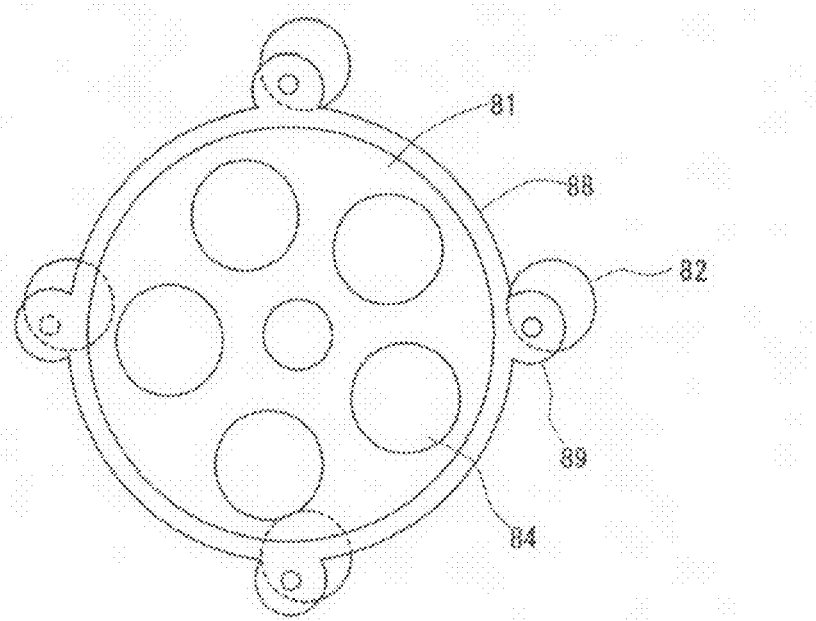
FIG. 7
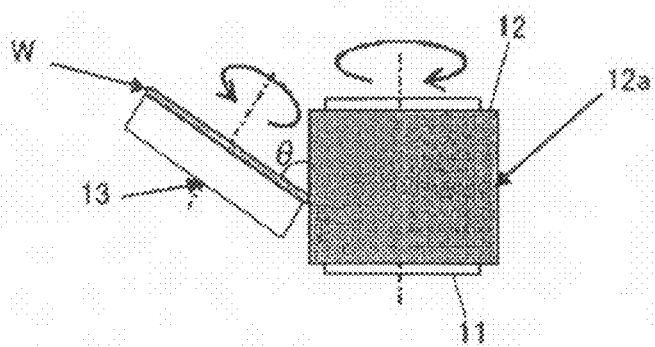
FIG. 8
(A)
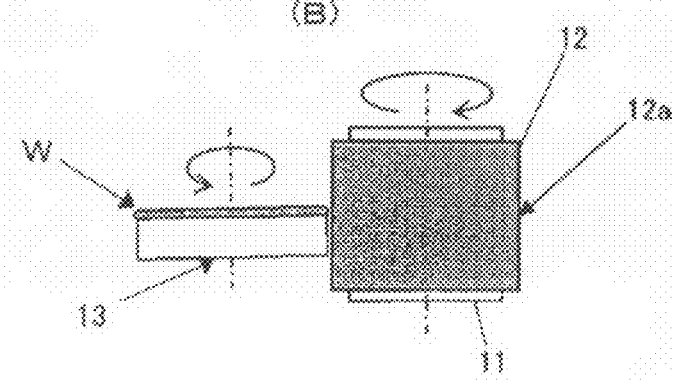
(B)

(A)

(B)

METHOD FOR PRODUCING SEMICONDUCTOR WAFER AND SEMICONDUCTOR WAFER

TECHNICAL FIELD

The present invention relates to a method for producing a semiconductor wafer, by which for example, in the case of producing a large-diameter silicon wafer having a diameter of 300 mm or more through a double-side polishing step and so forth, high flatness can be achieved even in a peripheral portion of the wafer, and relates to the semiconductor wafer.

BACKGROUND ART

A semiconductor wafer used for producing a semiconductor device, is produced by, for example, slicing a silicon single crystal ingot grown by a Czochralski method and thereby to process the ingot into a wafer shape, and then going through the respective steps of chamfering (grinding), lapping, etching, single-side polishing, chamfered-portion polishing (mirror chamfering), and so forth.

In recent years, along with rationalization of a process for producing a semiconductor device and reduction of cost, improvement of yield of device chips per one wafer has been required. In the case of silicon wafer, as the measures for improving the yield of device chips, large-diameter wafers have been more used, and a so-called peripheral excluded region of the wafer from which device chips are not obtained has been scaled-down.

For obtaining square-shaped chips from a circular wafer, a wafer having a large diameter has become advantageous. As well as in DRAM that has been conventionally a main stream, in production of recent flash memories for digital consumer electronics, wafers having a diameter of 300 mm is used and its production amount has drastically increased.

Moreover, the peripheral excluded region of the wafer has been scaled down from conventional 3 mm to 2 mm so that chips can be obtained from a larger range of the wafer. Furthermore, requirement of a peripheral excluded region of 1 mm has come out.

In the process for producing a silicon wafer having a large diameter of 300 mm, which is different from a method for producing a wafer having a diameter of 200 mm or less, a double-side polishing step of polishing front and back surfaces at the same time has been generally adopted for obtaining higher-precise flatness quality or nanotopographic quality in the wafer. In this case, for example, as shown in FIG. 15, a mirror-like silicon wafer can be obtained by going through the respective steps of slicing, chamfering, lapping (double-disc grinding, surface grinding), etching, double-side polishing, mirror chamfering, final polishing, and so forth.

The double-side polishing step is performed by using such an apparatus 70 as shown in FIG. 4. In the apparatus 70, wafers W are contained in circular holes 78 of carriers 75 as shown in FIG. 5, and sandwiched between a pair of upper and lower turn tables 71, 72 to which polishing pads 73, 74 are attached, and a polishing slurry is supplied and the upper and lower turn tables 71, 72 and the carrier 75 are rotated, and thereby the both surfaces of the wafers W are polished at the same time.

In the case of performing the double-polishing as described above, a peripheral portion (chamfered portion C) of the wafer W and an inside surface of the circular hole 78 in a carrier 75 are contacted and thereby scratch or impression in the chamfered portion C of the wafer W is generated. In order to remove the scratch and such, after the double-side polishing, it is general to polish the chamfered portion C of the wafer W.

Moreover, in a film-forming treatment step or a resist resin film-applying step in producing a device, occasionally, an oxide film or a nitride film is formed on the chamfered portion or a resist film adhered thereto. However, if the chamfered portion has surface roughness, these film components are in danger of being not removed in a subsequent cleaning step and so forth and remaining to be a dust generation source. However, when the chamfered portion is made to be a mirror surface, it becomes easy to remove an adhering resist film and such.

For polishing the chamfered portion, various types of polishing methods and polishing apparatus has been proposed. For example, as shown in FIG. 8(A), there is known a method in which the wafer W is held with a vacuum chuck stage 13 and the chamfered portion of an inclined wafer W is pressed with a certain pressure on a rotation drum 11 of which a polishing pad 12 is attached to the periphery, and thereby the chamfered portion is polished (see, International Publication WO 2002/005337).

Moreover, there are a method for polishing the entirety of the chamfered portion by, pressing each of polishing pads 21, 22 having inclined surfaces to be polished 21a, 22a and a polishing pad 24 having a perpendicular surface on the chamfered portion of the rotating wafer W as shown in FIG. 9, and a method for, polishing a chamfered surface of a main surface side of the chamfered portion of the wafer W with pressing a inverted cup-shaped polishing pad 31 on the chamfered portion, and then polishing the end surface (outermost peripheral surface) of the chamfered portion with pressing a perpendicular polishing pad 34 on the end surface, as shown in FIG. 10(A)(B).

However, when the chamfered portion is polished with inclining the wafer W with respect to the polishing pad 12, for example, as shown in FIG. 8(A) after the double-side polishing, intrusion of the polishing pad on the wafer surface (main surface) is caused and some region of a main surface in the vicinity of the chamfered portion is polished (in the present invention, referred to as "excessive polishing"), and flatness of the peripheral portion of the wafer made by double-side polishing becomes occasionally degraded. In particular, if a polishing pad made of flexible resin such as urethane is used, the excessively polished region is easily generated. Moreover, even in the case of polishing a chamfered portion as shown in FIG. 9 and FIG. 10, the similar excessively polished region is easily generated.

When the chamfered portion is polished after the double side polishing, there is a problem that even in any conventional method, excessive polishing that exceeds the border thereof with a main surface is easily caused and the excessive polishing has a harmful effect on a peripheral shape of the wafer main surface. In particular, as a region used in the wafer surface that is required in device production has been more expanded (the peripheral excluded region is more scaled down), influence of excessive polishing on the wafer has become larger.

DISCLOSURE OF THE INVENTION

An object of the present invention is to provide a method for producing a semiconductor wafer, by which when a semiconductor wafer is produced, scratch and such generated in the chamfered portion in a double-side polishing process can be removed and, excessive polishing in a peripheral portion of a main surface can be prevented from being caused in polishing a chamfered portion and thereby, the semiconductor wafer having a high flatness even in the vicinity of a chamfered portion is produced, and to provide the semiconductor wafer.

To achieve the above object, the present invention provides a method for producing a semiconductor wafer, comprising: at least a double-side polishing step; and a chamfered-portion polishing step;

wherein as a first chamfered-portion polishing step, at least, a chamfered portion of the wafer is polished so that a chamfered surface of each of main surface sides in the chamfered portion is in contact with a polishing pad; then the double-side polishing is performed;

as a second chamfered-portion polishing step, at least, the chamfered portion of the wafer is polished so that an end surface of the chamfered portion is in contact with a polishing pad and so that both main surfaces of the wafer are not in contact with a polishing pad.

When a chamfered surface of each of main surface sides in a chamfered portion of the semiconductor wafer is polished and then double-polishing is performed and then the end surface of the chamfered portion is polished as described above, scratch and such in the chamfered portion that are generated in the double polishing step can be certainly removed and additionally excessive polishing of the both main surface in the vicinity of the chamfered portion can be effectively suppressed. Therefore, the semiconductor wafer of which flat shape of the main surfaces made by the double-side polishing is maintained can be produced.

In the above case, it is preferable that the semiconductor wafer is a silicon wafer.

A silicon wafer is most highly demanded as a material for a semiconductor device, and in particular, because the double-side polishing is performed in production of a large-diameter silicon wafer having a diameter of 300 mm or more that has been mass-produced in recent years, the present invention becomes particularly effective.

Moreover, it is preferable that in the first chamfered-portion polishing step, only the chamfered surface of each of main surface sides in the chamfered portion is polished. And, it is preferable that in the second chamfered-portion polishing step, only the end surface of the chamfered portion is polished.

When only the chamfered surface of each of main surface sides in the chamfered portion is polished in the first chamfered-portion polishing step and only the end surface of the chamfered portion is polished in the second chamfered-portion polishing step, the chamfered portion can be efficiently polished and also excessive polishing that exceeds the border between the chamfered portion and the main surface can be more certainly prevented.

Furthermore, as the specific method for polishing the chamfered portion, it is possible that in the first chamfered-portion polishing step, the chamfered portion is polished so that the wafer is inclined at an angle in the range of 40-50° with respect to a polishing surface of the polishing pad, and it is possible that in the second chamfered-portion polishing step, the chamfered portion is polished so that the wafer is perpendicular to a polishing surface of the polishing pad.

In each of the chamfered-portion polishing steps, when the chamfered portion is polished so that the wafer is in contact with the polishing pad at a predetermined angle with respect thereto as described above, a predetermined surface in the chamfered portion can be easily and certainly polished.

It is preferable that the polishing pad used in the first chamfered-portion polishing step and the polishing pad used in the second chamfered-portion polishing step are different from each other.

Because polishing of the chamfered portion is separated to two steps in which respective separate surfaces are polished in the present invention, if special polishing pads are used for the respective steps, the predetermined surfaces in the chamfered portion can be efficiently polished.

Furthermore, the present invention provides a semiconductor wafer comprising, both surfaces and a chamfered portion that are polished, and a roll-off amount of 0.5 µm or less.

According to the present invention in which the chamfered-portion polishing is separately performed before and after the double-side polishing as described above, excessive polishing can be effectively prevented and thereby, for example, a double-side polished silicon wafer of which diameter is 300 mm or more and roll-off amount is suppressed to be 0.5 µm or less.

According to the present invention, when a semiconductor wafer is produced, the predetermined surfaces in the chamfered portion are polished separately before and after the double-side polishing and therefore, scratch and such in the chamfered portion are certainly removed and, excessive polishing of both main surfaces in the vicinity of the chamfered portion of the wafer can be effectively suppressed, and a flat shape made by the double-side polishing can be maintained. Accordingly, a semiconductor wafer having an excellent peripheral shape being capable of satisfying the peripheral excluded region of 1 mm to be required from now, as well as the peripheral excluded region of 2 mm that has been required now.

BRIEF EXPLANATION OF THE DRAWINGS

FIG. 7 is a schematic plan view showing an arrangement of a carrier in the double-side polishing apparatus of FIG. 6.

FIG. 8 is a schematic view showing an example of a method for polishing a chamfered portion.

BEST MODE FOR CARRYING OUT THE INVENTION

Hereinafter, the present invention will be specifically explained with reference to appended drawings. The present invention is not limited thereto.

The present inventors have investigated peripheral shape of the silicon wafer in the case that a double-side polishing of the wafer is performed and then a polishing of its chamfered portion.

Figure 17:
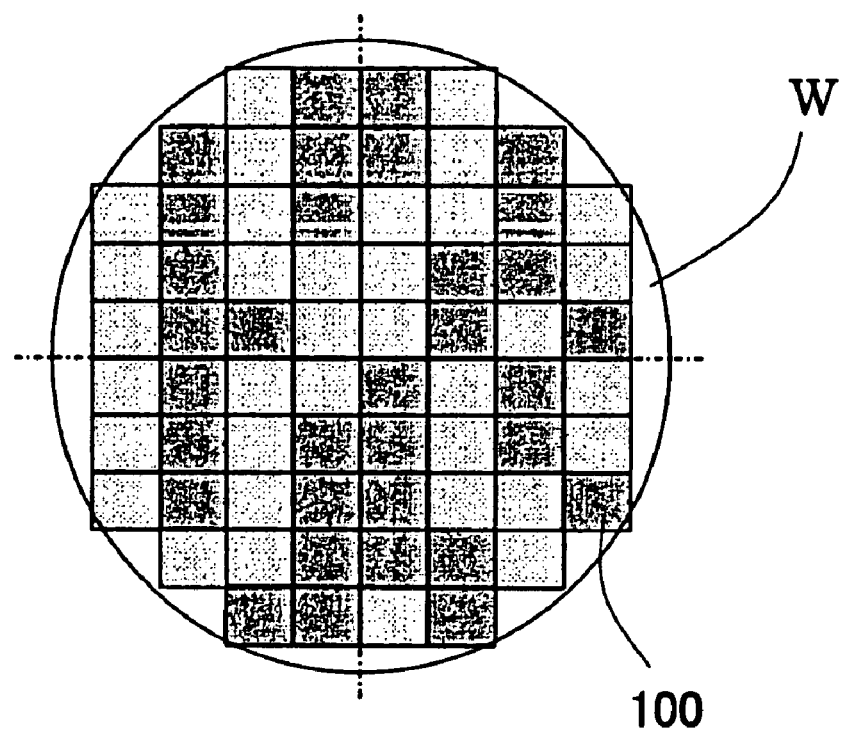
FIG. 17 is a schematic view showing one example of cells in evaluating site flatness.

In the case of evaluating flatness of a wafer, as shown in FIG. 17, the portion is divided into cells 100 each having a determined size in a site flatness defined by SFQR or SBIR having been conventionally performed, and then the evaluation is performed. Therefore, the peripheral shape in the vicinity of the chamfered portion cannot be accurately comprehended.

Figure 19:
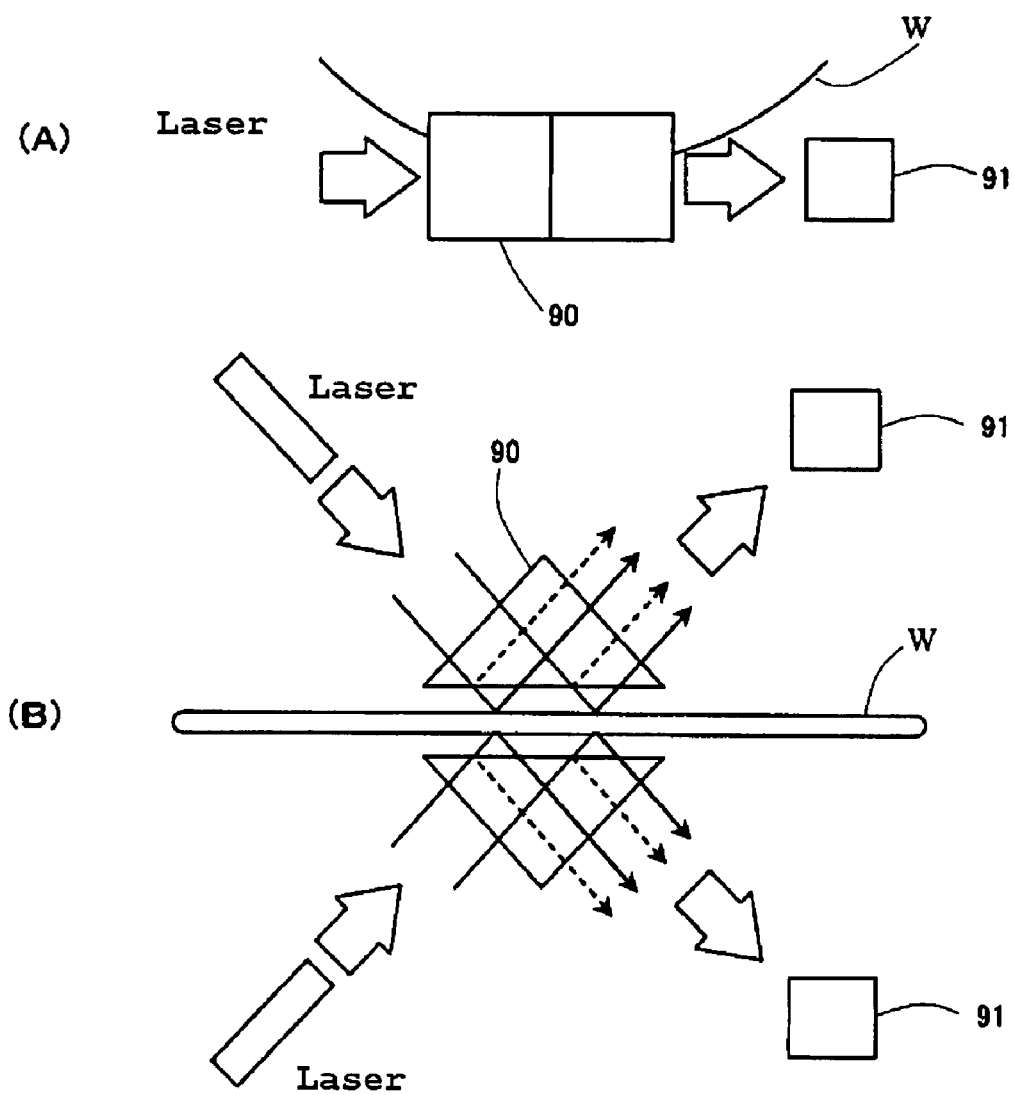
FIG. 19 is an explanation view showing the measurement principle of roll-off.

Accordingly, recently, for high-precisely evaluating the peripheral shape of the wafer, an evaluation standard called as roll-off has been adopted. The parameter referred to as roll-off can be high-precisely evaluated by directly measuring the peripheral shape of the wafer. In addition, the definition of roll-off is being standardized by a standard-setting organization. Therefore, for example, as shown in FIG. 19, there is a method that a laser light is irradiated to a wafer surface through a prism 90 and CCD 91 receives a reflected light and thereby the roll-off is measured. Then, the reference line is calculated from the surface profile and the roll-off amount can be obtained as the difference of the profile from the reference line.

Figure 18:
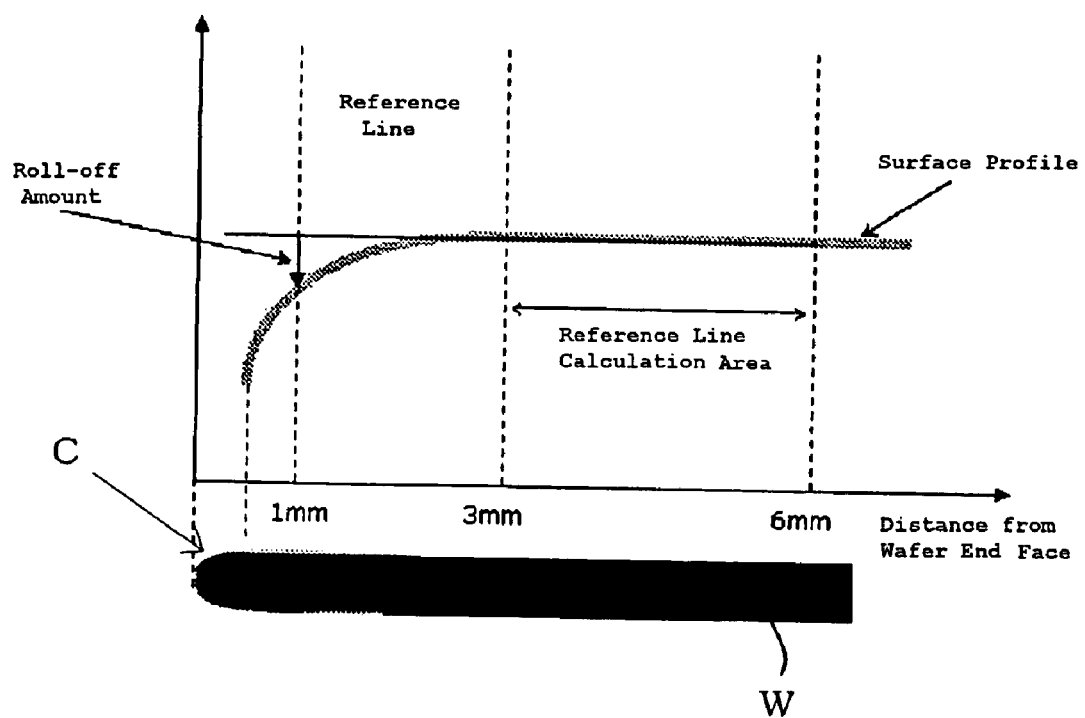
FIG. 18 is a graph showing a roll-off amount.

The present inventors has subjected a silicon wafer to double-side polishing and further polished the chamfered portion and then measured the roll-off amount. Therefore, the result as shown in FIG. 18 could be obtained. Here, it was found that the width of the chamfered portion C was approximately 0.3 mm or less and that roll-off amount of a main surface in the vicinity of the chamfered portion was large.

Figure 16:
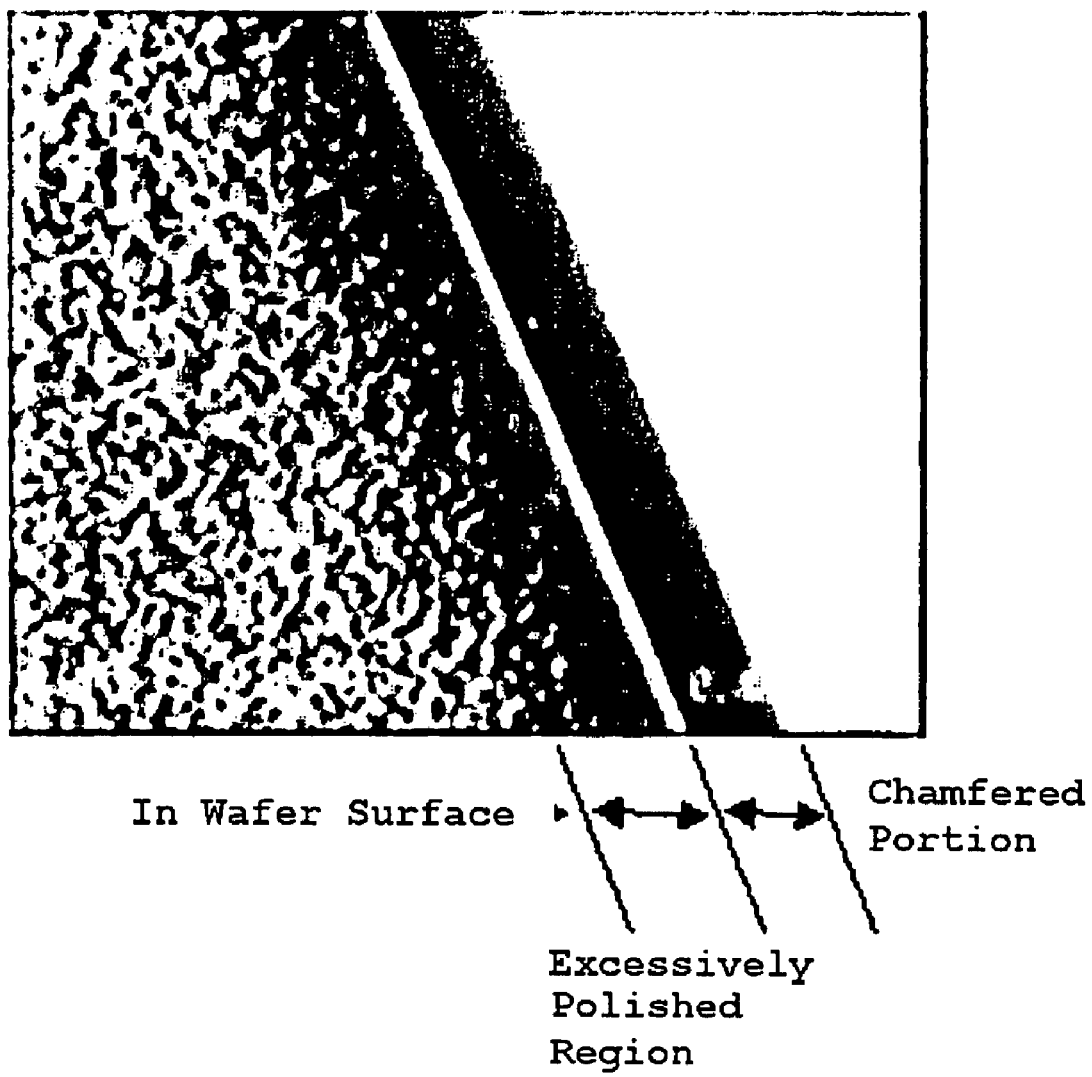
FIG. 16 is a view showing an excessively polished region observed by a microscope.

Furthermore, the vicinity of the border between the chamfered portion after the chamfered-portion polishing and a main surface was observed by a microscope. Therefore, as shown in FIG. 16, an excessively polished region in the wafer surface that exceeded the border of the surface and the chamfered portion was observed.

From the investigation results, it has been found that when the chamfered portion is polished, degradation of the flatness due to excessive polishing (roll-off) is extremely large.

Accordingly, the present inventors have thoroughly investigated methods for effectively preventing such excessive polishing as described above. It has been found that in the case in which before the double-side polishing step, a chamfered portion of the wafer is polished so that a chamfered surface of each of main surface sides in the chamfered portion is in contact and then, the double-side polishing step is performed and then, at least, the chamfered portion of the wafer is polished so that end surface of the chamfered portion is in contact with a polishing pad and so that both main surfaces of the wafer are not in contact with a polishing pad, excessive polishing can be prevented and degradation of roll-off can be effectively suppressed, and thereby scratch and such generated by the double-side polishing can be removed. Therefore, the present invention has been accomplished.

Figure 1:
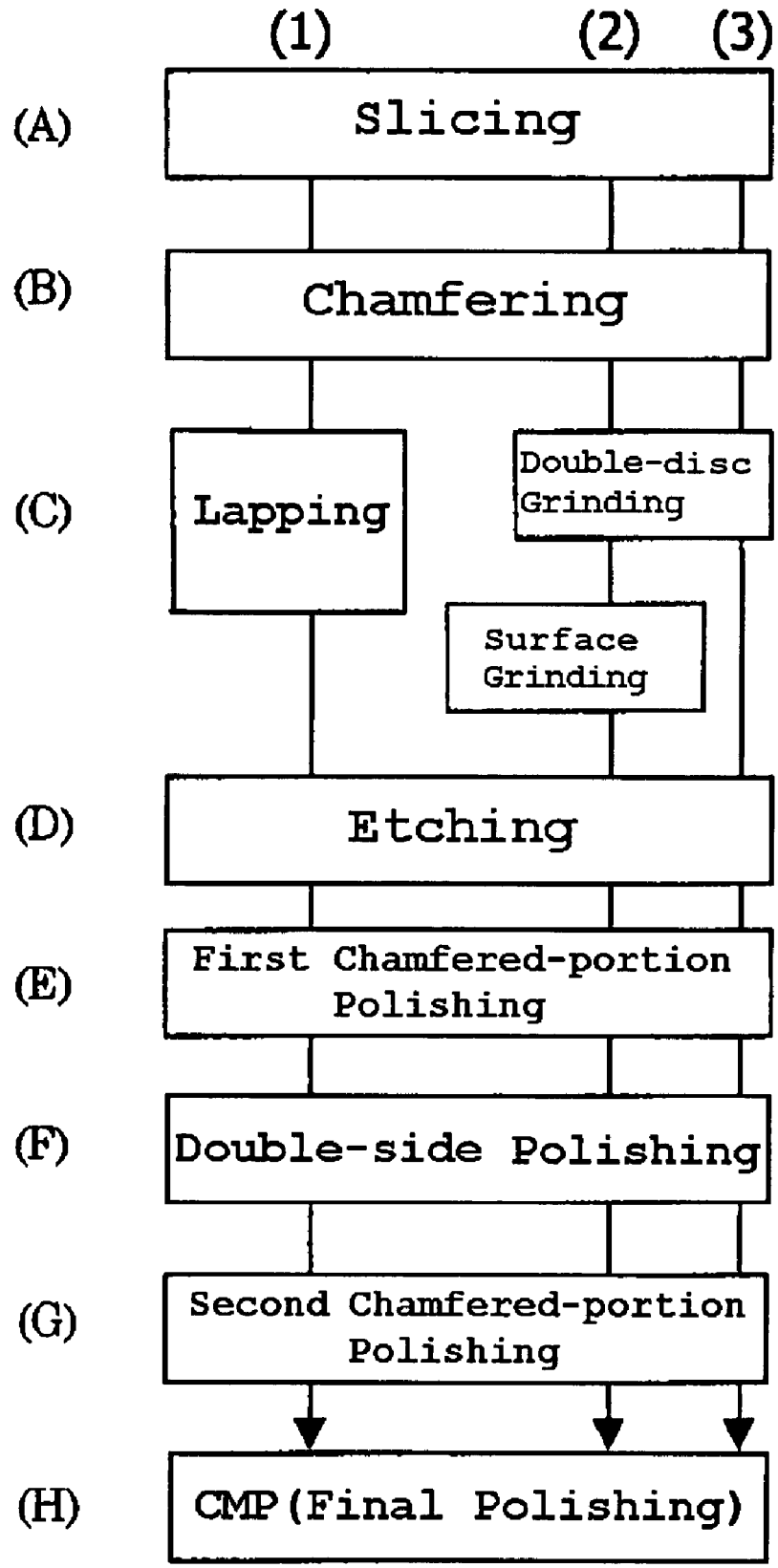
FIG. 1 is a flow chart showing an example of a process for producing a semiconductor wafer according to the present invention.

FIG. 1 shows an example of a process for producing a semiconductor wafer according to the present invention.

First, a silicon single crystal ingot grown by a Czochralski method (CZ method), a floating-zone melting method (FZ method), or the like is sliced into a wafer shape by using a wire saw or the like (FIG. 1(A)).

Next, for preventing break or crack of the peripheral border of a wafer, a chamfering process for removing the corner of the periphery of the wafer is performed (FIG. 1(B)).

Figure 2:
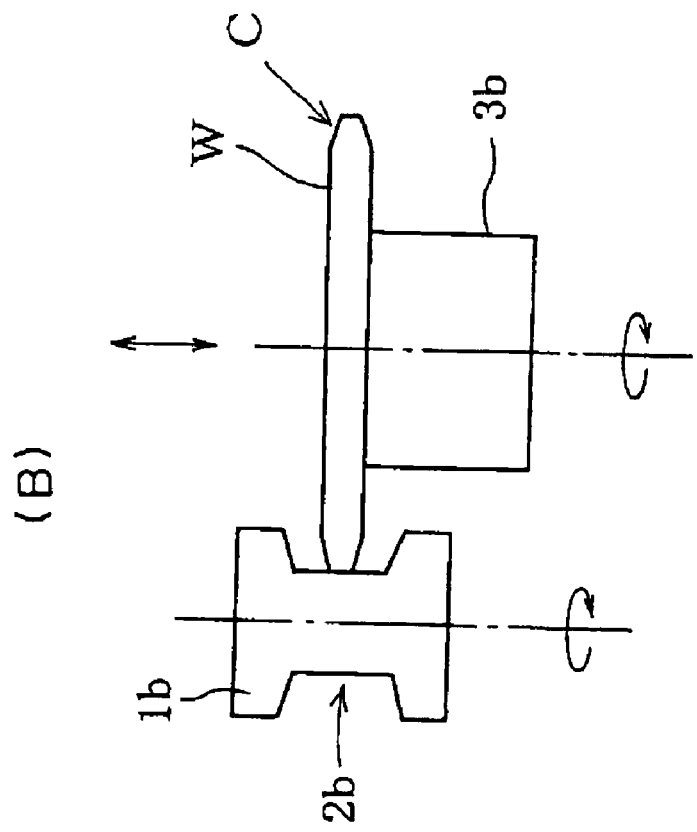
FIG. 2 is a schematic view showing examples of chamfering apparatuses.
Figure 2:
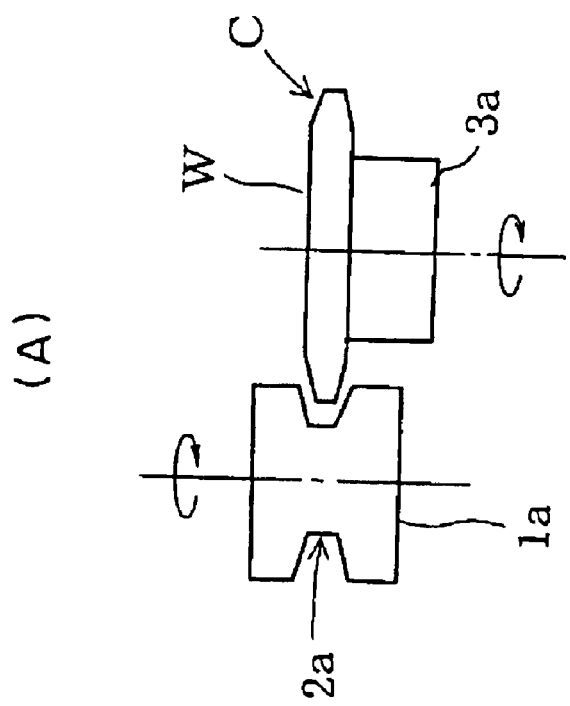

In the chamfering process, for example, as shown in FIG. 2(A), the peripheral border of the wafer is pressed on a groove 2a of a grinding wheel 1a having the same shape with the predetermined chamfered shape of the wafer, and therewith the corners in the upper surface side and the lower surface side of the wafer W and the outermost circumferential portion (end surface) that are held by a holding board 3a can be chamfered at the same time, and thereby a chamfered portion C can be formed.

Moreover, as shown in FIG. 2(B), it is also possible that the relative position between the wafer W and the grinding wheel is numerically controlled, and that by using a grinding wheel 1b having a groove 2b with an inverted trapezoid shape, the outermost circumferential portion (end surface) of the wafer is ground with a bottom surface of the groove 2b and, the corner in the upper side of the wafer W is chamfered with a taper surface in the upper side of the groove 2b and, the corner in the lower side of the wafer W is chamfered with a taper surface in the lower side of the groove 2b.

After the chamfering process, for making the thickness of the wafer be uniform and enhancing its flatness, lapping is performed (FIG. 1(C)).

In addition, the lapping may be performed before the chamfering process. Moreover, instead of lapping, it is possible to perform double-disc grinding of grinding both surfaces of the wafer at the same time by using a pair of grinding wheel, or surface grinding of grinding the wafer fixed to the holding board by grinding surfaces thereof one by one with a grinding wheel. Both the double-disc grinding and the surface grinding may be performed.

For removing the mechanical damage generated on the wafer by lapping or so forth, etching is performed with dipping the wafer in an etching solution (FIG. 1(D)).

For example, it is possible to perform an alkaline etching by using an aqueous solution of sodium hydroxide or potassium hydroxide or the like, or acid etching by using a mixed solution of hydrofluoric acid and nitric acid.

Next, in the present invention, as a first chamfer-polishing step, at least, a chamfered portion of the wafer is polished so that a chamfered surface of each of main surface sides in the chamfered portion is in contact with a polishing pad (FIG. 1(E)).

Figure 3:
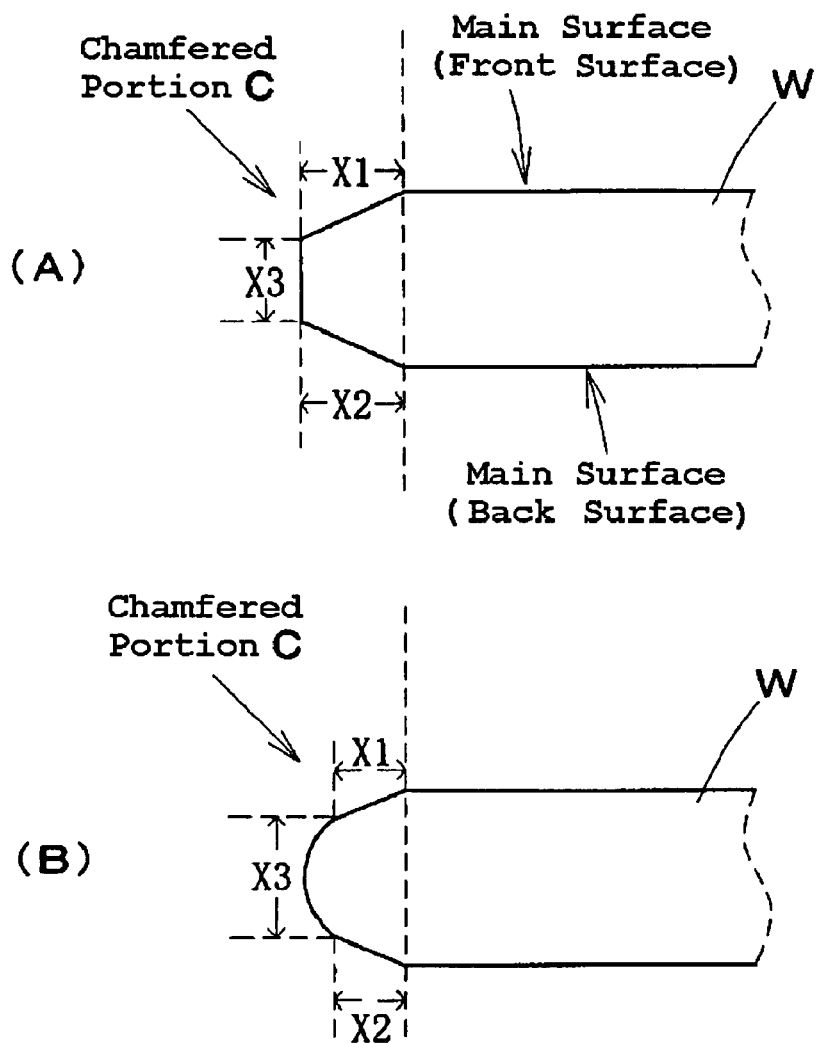
FIG. 3 is a schematic view showing examples of section shapes in chamfered portions of wafers.

Here, for example, as shown in FIG. 3(A), in a chamfered portion C having a rectangular-shaped cross section, a chamfered surface of each of main surface sides in the chamfered portion corresponds to a portion X1 or X2 that is continuous from a main surface and slopes to the outside. On the other hand, a portion X3 that is located in the outermost circumference of the wafer and approximately perpendicular to a main surface of the wafer W is called as an end surface of the chamfered portion in the present invention.

Therefore, when the wafer W has the chamfered-portion C having such a shape as shown in FIG. 3(A), at least, chamfered surfaces X1, X2 of the respective main surface sides in the chamfered portion C are polished in the first chamfer-polishing step.

In such a first chamfer-polishing step, for example, a polishing pad 12 of an external cylinder type attached to the periphery of a rotation drum 11 as shown in FIG. 8(A) can be used. In this case, along with rotating the drum 11 and the wafer W in a predetermined direction and supplying a polishing slurry containing colloidal silica and so forth thereto, the chamfered portion is polished so that the wafer W is pressed on the polishing surface 12a of the polishing pad 12 with being inclined at a predetermined angle (inclination angle) θ with respect thereto.

Here, if the inclination angle θ of the wafer W with respect to the polishing surface 12a of the polishing pad 12 is set to be less than 40°, the polishing pad 12 becomes easy to be in contact with the main surface of the wafer W as well as the chamfered portion, although depending on angle or shape of the chamfered surfaces X1, X2. And therefore, the main surface is in danger of being polished.

On the other hand, when the inclination angle θ is set to be more than 50°, a portion of the chamfered surfaces X1, X2 that is nearer to a main surface is not sufficiently polished. The portion that is not polished is in danger of causing generation of particles in the device process. Therefore, generally, it is preferable that the chamfered portion is polished with inclining the wafer at an angle in the range of 40-50° with respect to the polishing surface 12a of the polishing pad 12.

In this case, the polishing pad exceeds the border between the chamfered portion and the main surface, and thereby a portion of the main surface contiguous to the chamfered portion becomes polished. However, because flatness of the portion of the main surface can be recovered in the following double-side polishing step, it is allowed that the main surface of the wafer is polished to a certain extent in the first chamfer-polishing step.

In the first chamfer-polishing step, it is preferable that only the chamfered surfaces X1, X2 of each of main surface sides in the chamfered portion are polished. However, because excessive polishing in the main surface is not caused if the end surface X3 of the chamfered portion is polished, it is allowed to polish the entirety of the chamfered portion.

Figure 9:
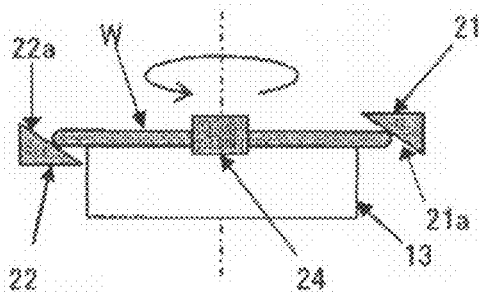
FIG. 9 is a schematic view showing another example of a method for polishing a chamfered portion.
Figure 10:
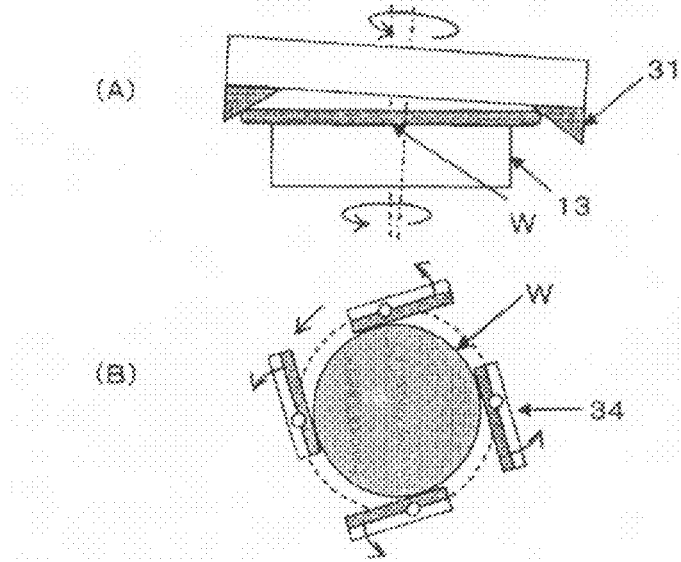
FIG. 10 is a schematic view showing another example of a method for polishing a chamfered portion.

In addition, the polishing pad (polishing apparatus) is not limited to the one of such an external cylinder type as FIG. 8(A). As shown in FIG. 9, by using upper and lower polishing pads 21, 22 having polishing surfaces 21a, 22a inclined at a predetermined angle, the chamfered surfaces X1, X2 of both of main surface sides in the chamfered portion of the wafer W may be polished at the same time. Moreover, an inverted cup-shaped polishing pad 31 as shown in FIG. 10(A) may be used.

Figure 11:
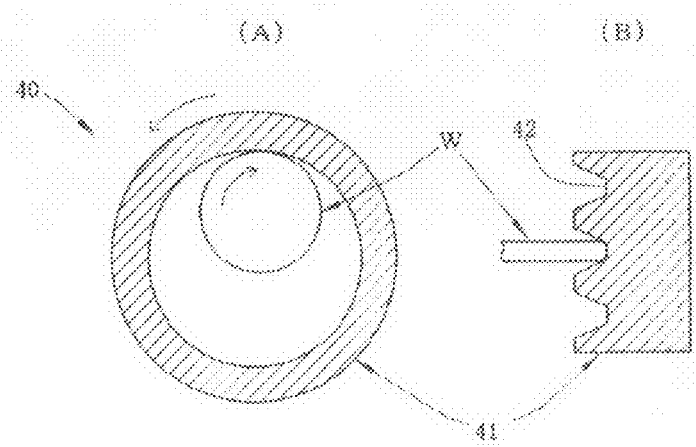
FIG. 11 is a schematic view showing another example of a method for polishing a chamfered portion.

Furthermore, a polishing pad 40 of an internal cylinder type as shown in FIG. 11 can also be used. In such a polishing pad 40 of an internal cylinder type, a groove 42 according to a shape of the chamfered portion is formed inside. Therefore, a polishing slurry is supplied and therewith the polishing pad 40 and the wafer W are rotated respectively and contacted, and thereby the chamfered surfaces X1, X2 of the respective main surfaces in the chamfered portion or the entirety of the chamfered portion can be polished.

After the first chamfered-portion polishing is performed, the double-side polishing is performed (FIG. 1(F)).

Figure 4:
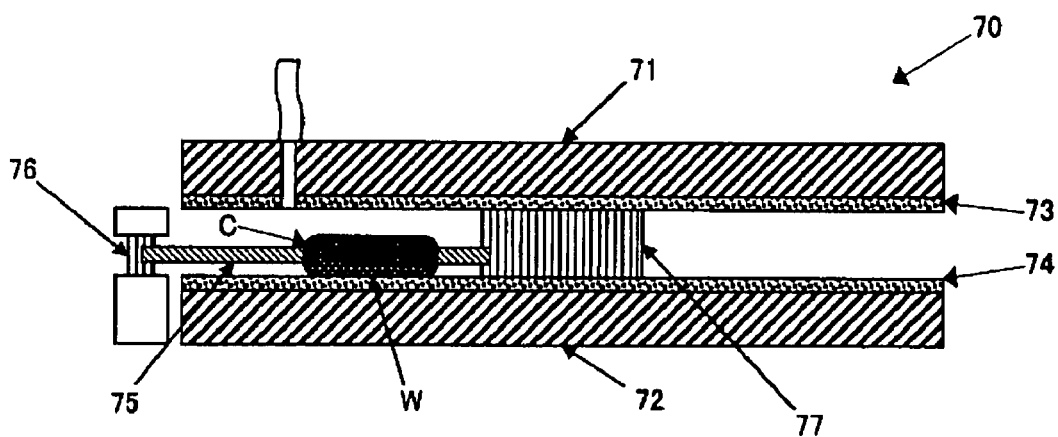
FIG. 4 is a schematic section view showing an example of a double-side polishing apparatus.
Figure 5:
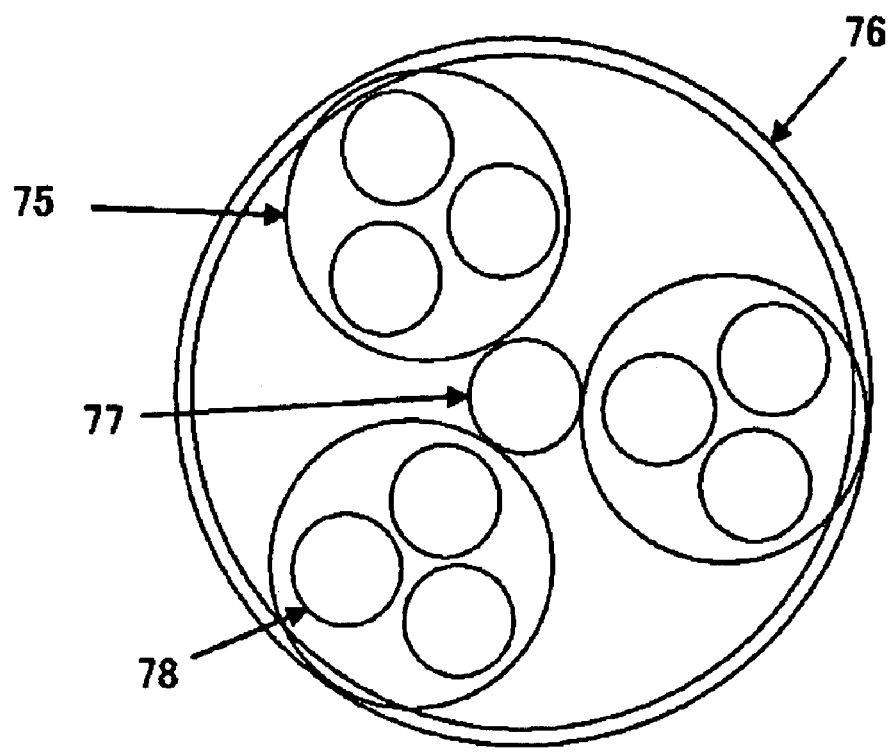
FIG. 5 is a schematic plan view showing an arrangement of carriers in the double-side polishing apparatus of FIG. 4.

For example, such a double-side polishing apparatus 70 as shown in FIG. 4 and FIG. 5 can be used. As described above, in the apparatus 70, wafers W were contained in circular holes 78 of carriers 75, and sandwiched between polishing pads 73, 74 attached to a pair of upper and lower turn tables 71, 72. Then, a polishing slurry is supplied and therewith the carriers 75 are rotated with an internal gear 76 and a sun gear 77, and thereby the both surfaces of the wafers W are polished at the same time.

By performing such double-side polishing, surface roughness of the wafer W is improved and flatness can be improved.

Figure 6:
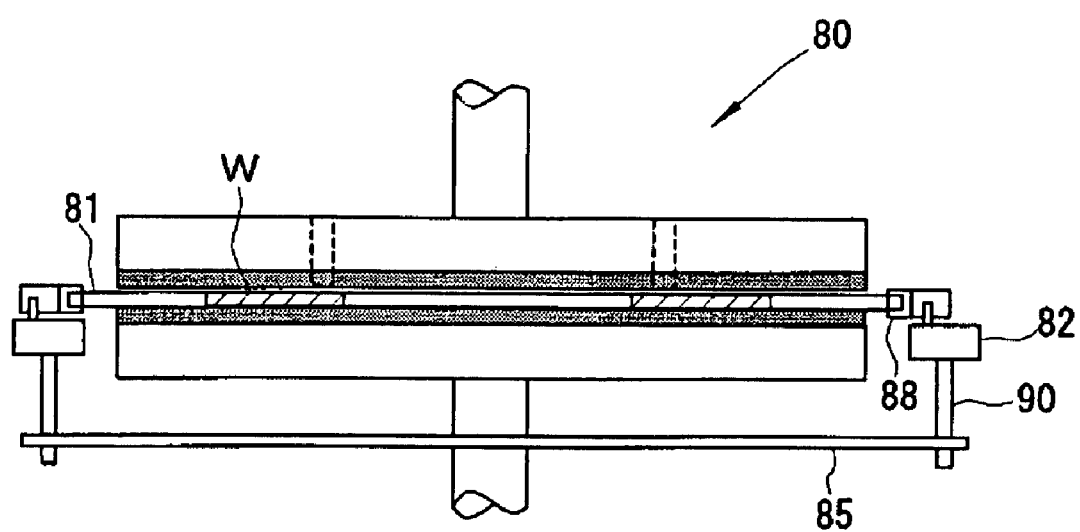
FIG. 6 is a schematic section view showing another example of a double-side polishing apparatus.

Moreover, a double-side polishing apparatus 80 as shown in FIG. 6 and FIG. 7 can also be used. In the apparatus 80, in polishing, all of eccentric arms 82 are rotated so as to be synchronized with centering rotation shafts 90 through timing chains 85. Thereby, a carrier 81 held at carrier holder 88 circulates so as to draw a small circle in a horizontal plane without rotating on its axis. Such a double-side polishing apparatus 80 of an oscillating type can be downsized. Therefore, polishing operation of a large-diameter wafer can be performed in a relatively narrow space. Along with enlargement of the diameter of the wafer in recent years, such a double-side polishing apparatus 80 of an oscillating type has been largely used.

After the double-side polishing is performed, a second chamfered-portion polishing step (FIG. 1(G)) is performed in the present invention. In the second chamfered-portion polishing step, at least, the chamfered portion of the wafer is polished so that an end surface X3 of the chamfered portion is in contact with a polishing pad and so that both main surfaces of the wafer are not in contact with a polishing pad.

Because the chamfered surfaces X1, X2 of the respective main surfaces in the chamfered portion have already polished by the above-described first double-side polishing step, when an end surface X3 of the chamfered portion of the wafer is polished with being in contact with a polishing pad in the second chamfered-portion polishing step, scratch or such generated in the chamfered portion by getting contact with the carrier in the double-side polishing step are removed, and thereby the entirety of the chamfered portion becomes polished.

In this case, in the second chamfered-portion polishing step, if the polishing is performed in a state that the polishing pad is in contact with the main surface of the wafer W, excessive polishing is caused in the vicinity of the border of the main surface and the chamfered portion, and leads to cause degradation of the peripheral shape of the wafer W. Therefore, the chamfered portion is polished so that both main surfaces of the wafer W are not in contact with a polishing pad.

Figure 12:
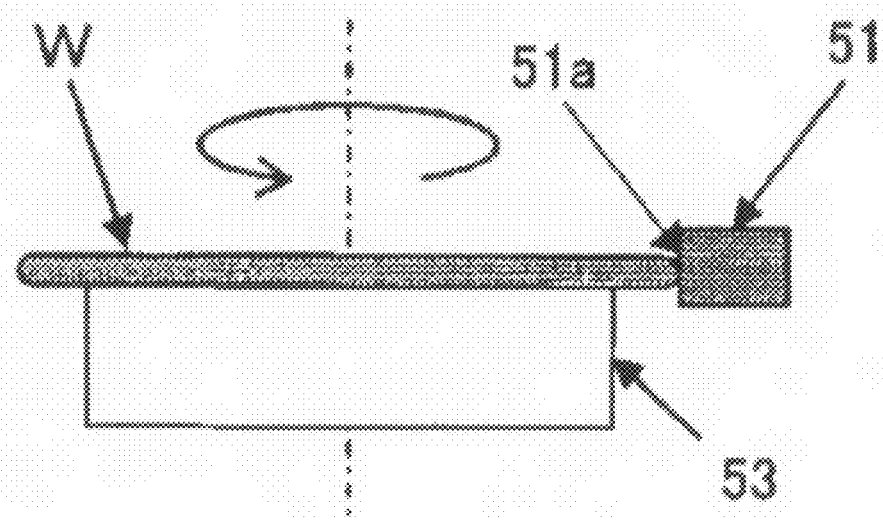
FIG. 12 is a schematic view showing an example of a method for polishing the end surface of a chamfered portion.

For example, the chamfered portion is polished so that the wafer W is perpendicular to the polishing surface 51a of the polishing pad 51 for the end surface as shown in FIG. 12. Thereby, at least, the end surface X3 of the chamfered portion of the wafer W can be polished so that both main surfaces of the wafers avoid being in contact with the polishing pad 51 and so that the end surface X3 of the chamfered portion is certainly in contact with the polishing pad 51. Therefore, scratch generated in the end surface in the double-polishing step of the main surfaces can be certainly removed.

Figure 13:
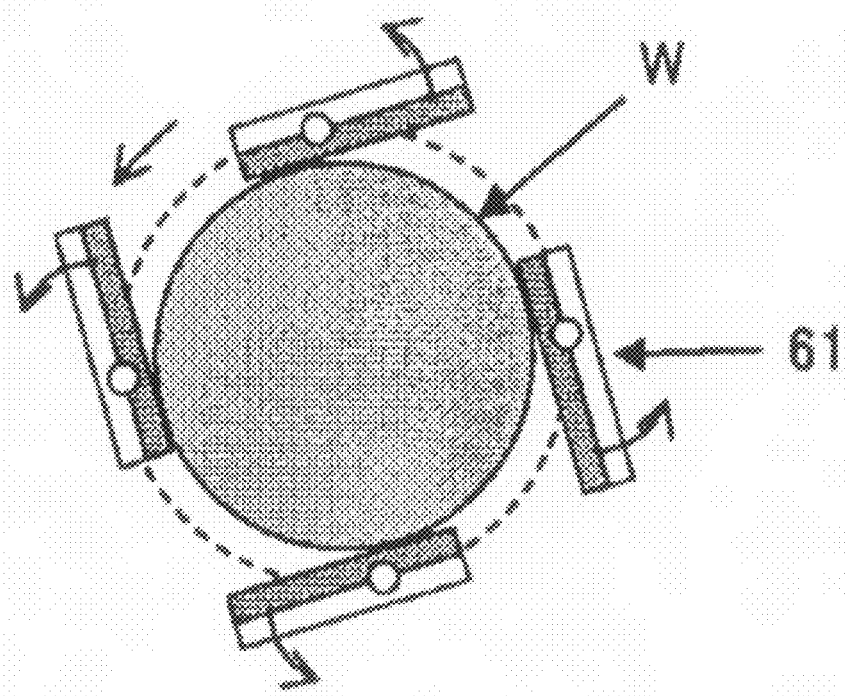
FIG. 13 is a schematic view showing another example of a method for polishing the end surface of a chamfered portion.

Moreover, the chamfered portion may be polished by using such a polishing pad 61 as shown in FIG. 13. A plurality of polishing pads 61 disposed around the wafer W are synchronized and revolved, and each of the polishing pads 61 is made to be in contact with the end surface X3 of the chamfered portion of the wafer W, and thereby, the polishing can be efficiently performed.

In addition, in the case of performing the second chamfered-portion polishing step, it is preferable to polish only the end surface X3 of the chamfered portion. However, by sinkage of the polishing pad and so forth, the chamfered surfaces X1, X2 of the chamfered portion may be in contact with the polishing pad, too. The chamfered surfaces X1, X2 are polished in the first chamfered-portion polishing step, and therefore, are not necessarily polished, here. However, as long as the polishing pad is not in contact with a main surface of the wafer W, excessive polishing is not caused and particularly a problem is not caused, and scratch generated by the double-side polishing can be more certainly removed.

By the way, a cross-section shape of the chamfered portion of the wafer that is formed by the chamfering process is not limited to a rectangular shape composed of straight lines as shown in FIG. 3(A). For example, as shown in FIG. 3(B), the outermost circumferential portion occasionally becomes a curved surface. In the case of the chamfered portion having such a shape, the chamfered surfaces of the respective main surface sides in the chamfered portion correspond to the sloping portions X1, X2 each being continuous to each of the main surfaces, and the curved surface portion outside the sloping portions can be the end surface.

Moreover, the border between the chamfered surface of each of main surface sides in the chamfered portion and the end surface may be unclear such as a case that the cross-section shape of the chamfered portion is a semicircular shape or a semielliptic shape. In this case, the region of the chamfered portion in which scratch and such can be generated by getting contact with a carrier in the double-side polishing step may be determined as the end surface of the chamfered portion. Specifically, the width of the chamfered portion is generally approximately 0.3 mm, and therefore, in the chamfered portion, for example, the outside 0.1 mm region can be set to be the end surface, and the inner region of the outside region can be set to be the chamfered surface of a main surface side.

Then, in order that an unpolished portion in the chamfered portion does not remain finally, the chamfered surface of each of main surface sides in the chamfered portion that is continuous from each of the main surfaces is polished in the first chamfered-portion polishing step, and after the double-side polishing, the end surface of the chamfered portion is polished in the second chamfered-portion polishing step, and thereby, scratch and such generated in the chamfered portion by getting contact with the carrier in double-side polishing of the previous step can be removed.

It is preferable that as the polishing pad used in the second chamfered-portion polishing step, a special polishing pad is used because the surface to be polished in the chamfered portion is different from that of the first chamfered-portion polishing step. However, for example, such a polishing pad 12 of an external cylinder type as shown in FIGS. 8(A)(B) is used together, and in each of the steps, the angle of the wafer W with respect to the polishing pad 12 is adjusted, and then each polishing of the chamfered portion can also be performed.

After the second chamfered-portion polishing step is performed, final polishing is performed (FIG. 1(H)). Such final polishing can be performing by, for example, single-side polishing only the side in which a device is to be formed, with sticking and holding one surface of the wafer and supplying a polishing slurry. The single-side polishing may be performed by attaching the wafer to the plate through an adhesive agent such as wax. In addition, if an amount of stock removal becomes large in the final polishing, flatness of peripheral region of the wafer is in danger of being degraded, and therefore, it is preferable that the stock removal is 2 μm or less, particularly, approximately 1 μm.

When the silicon wafer is produced by going through such steps as described above, scratch and such generated in the chamfered portion in the double-side polishing step are removed, and also excessive polishing of the main surface in the vicinity of the chamfered portion can be prevented. Therefore, a mirror silicon wafer having a high flatness in which the flatness made by the double-side polishing even in the vicinity of the chamfered portion can be produced.

Hereinafter, Example and Comparative example of the present invention will be explained.

EXAMPLE

A silicon wafer having a diameter of 300 mm was obtained by performing the respective treatments of slicing, chamfering, lapping, and etching, in order. As the first chamfered-portion polishing step, the chamfered portion of the wafer was polished so that the chamfered surface of each of main surface sides in the chamfered portion was in contact with a polishing pad. In the first chamfered-portion polishing, a IV-type mirror-chamfering apparatus manufactured by Speedfam Co., Ltd. was used, and as shown in FIG. 8(A), the chamfered portion was polished by inclining the wafer at 45° with respect to the polishing surface of the polishing pad.

After the first chamfered-portion polishing step, the double-side polishing was performed by using such a double-side polishing apparatus as shown in FIG. 6.

After the double-side polishing, further the second chamfered-portion polishing step was performed. In the second chamfered-portion polishing step, the wafer is set to be perpendicular to the polishing surface of the polishing pad as shown in FIG. 8(B), and thereby, the chamfered portion of the wafer is polished so that an end surface of the chamfered portion is in contact with the polishing pad and so that both main surfaces of the wafer are not in contact with a polishing pad.

In addition, in the first and second chamfered-portion polishing step, as the polishing pad, SUBA 400 manufactured by Rodale Inc. was used, and as the polishing agent, a polishing slurry adjusted to pH 11.0 based on AJ1325 manufactured by Nissan Chemical Industries, Ltd. was supplied at a flow rate of 2 liters/min, and polishing load was set to 2.0 kgf, and thereby the chamfered portion was polished.

Furthermore, after the second chamfered-portion polishing, by using a single-side polishing apparatus, one surface of the wafer was subjected to final polishing. In the final polishing, the same slurry as the one used in the chamfered-portion polishing step was supplied, and the polishing was performed so that the stock removal became approximately 1 μm.

The roll-off measurements were performed after the double-side polishing, after the second chamfered portion polishing step, and further after the final polishing, respectively. For the roll-off measurement, such a roll-off measurement apparatus (LER-310M, measured by Kobelco Research Institute Inc.) was used. As the measurement condition, based on the reference extrapolation line that was calculated from the region of 3-6 mm from the wafer end surface by a method of least squares, the roll-off amount at the position of 1 mm from the wafer end face was measured.

COMPARATIVE EXAMPLE

A wafer was obtained by being subjected to the respective treatments of slicing, chamfering, lapping, etching, and double-side polishing, in order. The wafer was subjected to chamfered-portion polishing. The chamfered-portion polishing was performed by using such a mirror-chamfering apparatus (IV type manufactured by Speedfam Co., Ltd.) in which a polishing pad attached to the periphery of a rotation drum as shown in FIG. 8(A). After the chamfered portion was polished, further, one surface of the wafer was subjected to final polishing in the same manner as Example.

The roll-off amounts of the wafer were measured after the double-side polishing, after the treatment of the chamfered portion, and after the final polishing, respectively.

Figure 14:
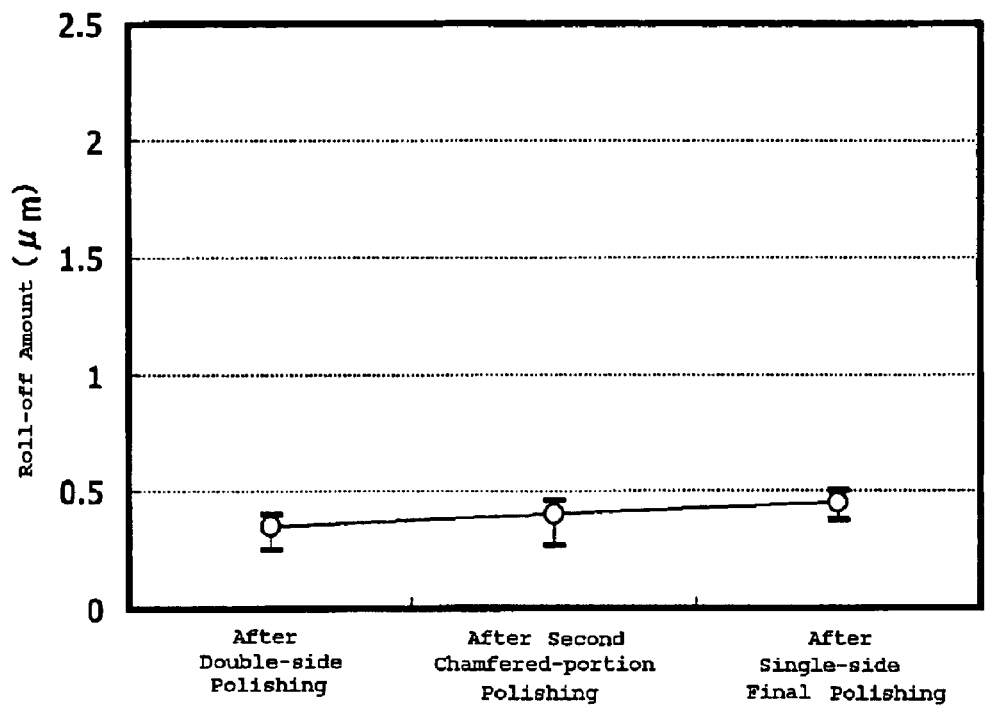
FIG. 14 is a graph showing roll-off amounts of Example and Comparative example. (A) Example, (B) Comparative example
Figure 14:
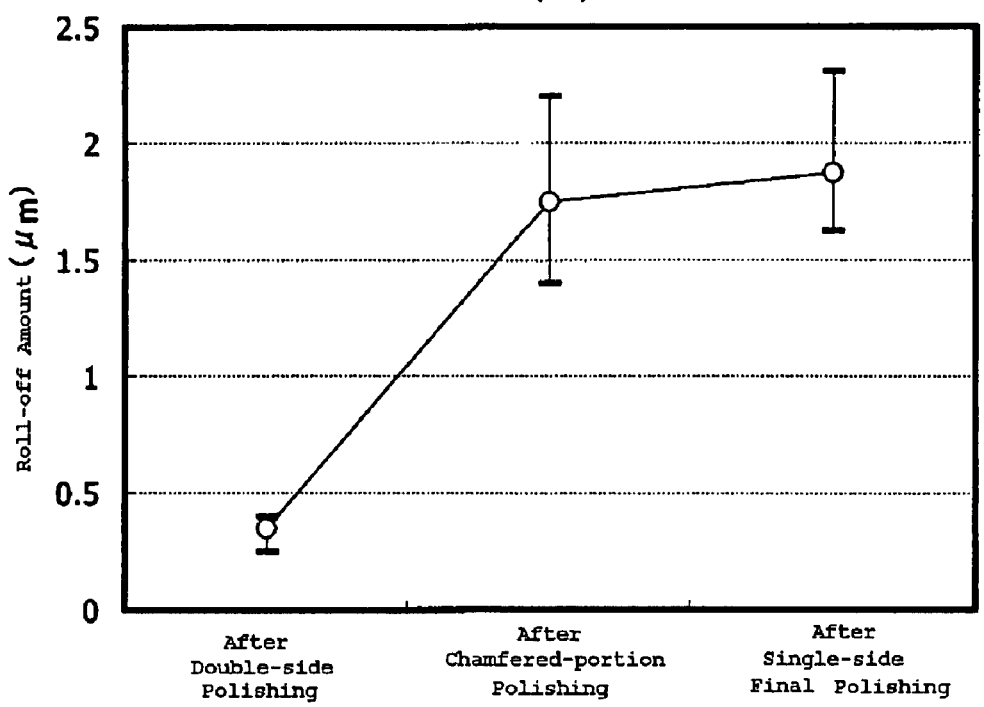
Figure 15:
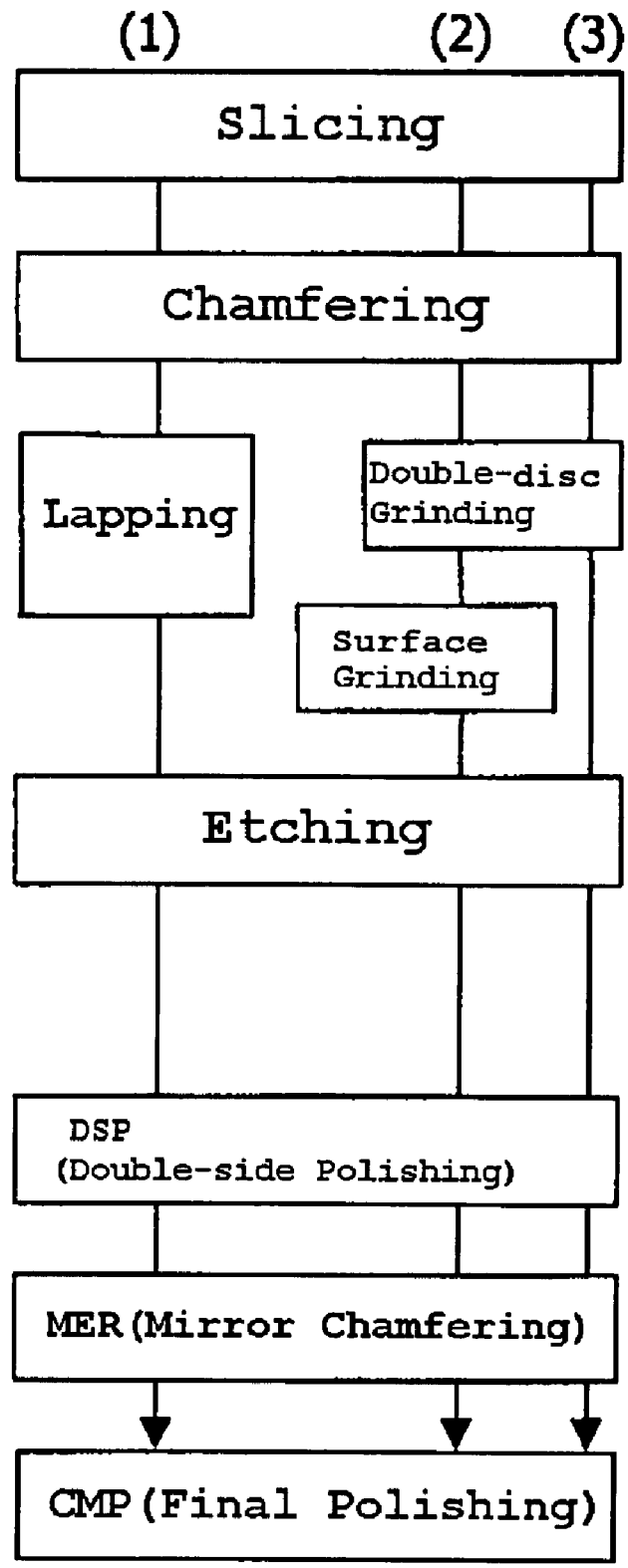
FIG. 15 is a flow chart showing an example of a conventional process for producing a silicon wafer.

The roll-off amounts measured in Example and Comparative example are shown in FIG. 14(A)(B), respectively.

In Comparative example (FIG. 14(B)), the roll-off amount (average) after the double-side polishing was approximately 0.35 μm, and was degraded to be 1.75 μm after the chamfered-portion polishing, and further degraded to be 2.31 μm after the singe-side final polishing.

On the other hand, in Example (FIG. 14(A)), the roll-off amount (average) after the double-side polishing was 0.35 μm, which was the same as Comparative example. However, the amount was suppressed to be approximately 0.4 μm after the second chamfered-portion polishing, and further, suppressed to be approximately 0.45 μm after the single-side final polishing. It was found that the high-precise shape after the double-side polishing was almost maintained.

In addition, each of the mirror wafers obtained in Example and Comparative example was visually checked, and it was investigated whether scratch in the chamfered portion existed or not. Therefore, the results were at the same level.

The present invention is not limited to the above-described embodiments. The above-described embodiments are mere examples, and those having the substantially same constitution as that described in the appended claims and providing the similar action and advantages are included in the scope of the present invention.

For example, in the above-described embodiments, the case of producing a silicon wafer is described. However, the present invention is applicable to production of another semiconductor wafer.

Moreover, the production process is not limited to the one described in the embodiments. For example, a cleaning step or a heat-treating step may be added. Alternatively, the invention of the present application includes a case in which a wafer that is preliminarily subjected to a chamfering process is prepared and then is subjected to the first chamfer-polishing step, the double-side polishing step, and the second chamfer-polishing step, which are according to the present invention, in order.

The invention claimed is:

1. A method for producing a semiconductor wafer, the wafer having two main surfaces, comprising:
   a chamfering step to chamfer the wafer to form a chamfered portion of the wafer, the chamfered portion including a first portion at a periphery of the wafer, and a second portion between the first portion and each main surface, the first portion having an end surface, each second portion having a chamfered surface that slopes from the respective main surface to the end surface;
   a first chamfered-portion polishing step that polishes the chamfered-portion of the wafer so that at least one chamfered surface in the chamfered portion of the wafer is in contact with a polishing pad;
   a double-side polishing step that polishes both main surfaces of the wafer;
   a second chamfered-portion polishing step that polishes the chamfered-portion of the wafer so that at least the end surface of the chamfered portion of the wafer is in contact with a polishing pad; and so that both main surfaces of the wafer are not in contact with a polishing pad during the second chamfered-portion polishing step.

2. The method for producing a semiconductor wafer according to claim 1, wherein the semiconductor wafer is a silicon wafer.

3. The method for producing a semiconductor wafer according to claim 1, wherein in the first chamfered-portion polishing step, only the chamfered surface of each of main surface sides in the chamfered portion is polished.

4. The method for producing a semiconductor wafer according to claim 2, wherein in the first chamfered-portion polishing step, only the chamfered surface of each of main surface sides in the chamfered portion is polished.

5. The method for producing a semiconductor wafer according to claim 1, wherein in the second chamfered-portion polishing step, only the end surface of the chamfered portion is polished.

6. The method for producing a semiconductor wafer according to claim 2, wherein in the second chamfered-portion polishing step, only the end surface of the chamfered portion is polished.

7. The method for producing a semiconductor wafer according to claim 3, wherein in the second chamfered-portion polishing step, only the end surface of the chamfered portion is polished.

8. The method for producing a semiconductor wafer according to claim 4, wherein in the second chamfered-portion polishing step, only the end surface of the chamfered portion is polished.

9. The method for producing a semiconductor wafer according to claim 1, wherein in the first chamfered-portion polishing step, the chamfered portion is polished so that the wafer is inclined at an angle in the range of 40-50° with respect to a polishing surface of the polishing pad.

10. The method for producing a semiconductor wafer according to claim 2, wherein in the first chamfered-portion polishing step, the chamfered portion is polished so that the wafer is inclined at an angle in the range of 40-50° with respect to a polishing surface of the polishing pad.

11. The method for producing a semiconductor wafer according to claim 3, wherein in the first chamfered-portion polishing step, the chamfered portion is polished so that the wafer is inclined at an angle in the range of 40-50° with respect to a polishing surface of the polishing pad.

12. The method for producing a semiconductor wafer according to claim 4, wherein in the first chamfered-portion polishing step, the chamfered portion is polished so that the wafer is inclined at an angle in the range of 40-50° with respect to a polishing surface of the polishing pad.

13. The method for producing a semiconductor wafer according to claim 5, wherein in the first chamfered-portion polishing step, the chamfered portion is polished so that the wafer is inclined at an angle in the range of 40-50° with respect to a polishing surface of the polishing pad.

14. The method for producing a semiconductor wafer according to claim 6, wherein in the first chamfered-portion polishing step, the chamfered portion is polished so that the wafer is inclined at an angle in the range of 40-50° with respect to a polishing surface of the polishing pad.

15. The method for producing a semiconductor wafer according to claim 7, wherein in the first chamfered-portion polishing step, the chamfered portion is polished so that the wafer is inclined at an angle in the range of 40-50° with respect to a polishing surface of the polishing pad.

16. The method for producing a semiconductor wafer according to claim 8, wherein in the first chamfered-portion polishing step, the chamfered portion is polished so that the wafer is inclined at an angle in the range of 40-50° with respect to a polishing surface of the polishing pad.

17. The method for producing a semiconductor wafer according to claim 1, wherein in the second chamfered-portion polishing step, the chamfered portion is polished so that the wafer is perpendicular to a polishing surface of the polishing pad.

18. The method for producing a semiconductor wafer according to claim 2, wherein in the second chamfered-portion polishing step, the chamfered portion is polished so that the wafer is perpendicular to a polishing surface of the polishing pad.

19. The method for producing a semiconductor wafer according to claim 3, wherein in the second chamfered-portion polishing step, the chamfered portion is polished so that the wafer is perpendicular to a polishing surface of the polishing pad.

20. The method for producing a semiconductor wafer according to claim 4, wherein in the second chamfered-portion polishing step, the chamfered portion is polished so that the wafer is perpendicular to a polishing surface of the polishing pad.

21. The method for producing a semiconductor wafer according to claim 5, wherein in the second chamfered-portion polishing step, the chamfered portion is polished so that the wafer is perpendicular to a polishing surface of the polishing pad.

22. The method for producing a semiconductor wafer according to claim 6, wherein in the second chamfered-portion polishing step, the chamfered portion is polished so that the wafer is perpendicular to a polishing surface of the polishing pad.

23. The method for producing a semiconductor wafer according to claim 7, wherein in the second chamfered-portion polishing step, the chamfered portion is polished so that the wafer is perpendicular to a polishing surface of the polishing pad.

24. The method for producing a semiconductor wafer according to claim 8, wherein in the second chamfered-portion polishing step, the chamfered portion is polished so that the wafer is perpendicular to a polishing surface of the polishing pad.

25. The method for producing a semiconductor wafer according to claim 1, wherein the polishing pad used in the first chamfered-portion polishing step and the polishing pad used in the second chamfered-portion polishing step are different from each other.

26. The method for producing a semiconductor wafer according to claim 2, wherein the polishing pad used in the first chamfered-portion polishing step and the polishing pad used in the second chamfered-portion polishing step are different from each other.

27. The method for producing a semiconductor wafer according to claim 3, wherein the polishing pad used in the first chamfered-portion polishing step and the polishing pad used in the second chamfered-portion polishing step are different from each other.

28. The method for producing a semiconductor wafer according to claim 4, wherein the polishing pad used in the first chamfered-portion polishing step and the polishing pad used in the second chamfered-portion polishing step are different from each other.

29. The method for producing a semiconductor wafer according to claim 5, wherein the polishing pad used in the first chamfered-portion polishing step and the polishing pad used in the second chamfered-portion polishing step are different from each other.

30. The method for producing a semiconductor wafer according to claim 6, wherein the polishing pad used in the first chamfered-portion polishing step and the polishing pad used in the second chamfered-portion polishing step are different from each other.

31. The method for producing a semiconductor wafer according to claim 7, wherein the polishing pad used in the first chamfered-portion polishing step and the polishing pad used in the second chamfered-portion polishing step are different from each other.

32. The method for producing a semiconductor wafer according to claim 8, wherein the polishing pad used in the first chamfered-portion polishing step and the polishing pad used in the second chamfered-portion polishing step are different from each other.

* * * * *